(12) United States Patent
Ichinose et al.

(10) Patent No.: US 6,504,244 B2
(45) Date of Patent: Jan. 7, 2003

(54) SEMICONDUCTOR DEVICE AND SEMICONDUCTOR MODULE USING THE SAME

(75) Inventors: Michihiko Ichinose, Tokyo (JP); Tomoko Takizawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/773,341

(22) Filed: Jan. 31, 2001

(65) Prior Publication Data

US 2001/0010396 A1 Aug. 2, 2001

(30) Foreign Application Priority Data

Feb. 2, 2000 (JP) ........................................ 2000-025611

(51) Int. Cl.[7] ............................................. H01L 23/34
(52) U.S. Cl. ........................ 257/723; 257/777; 257/685; 257/686; 257/776
(58) Field of Search ................................ 257/783, 782, 257/784, 786, 778, 776, 730, 709, 724, 723, 685, 668, 686, 688, 727, 787

(56) References Cited

U.S. PATENT DOCUMENTS

| 5,008,496 A | * | 4/1991 | Schmidt et al. ............. 174/254 |
| 5,229,916 A | * | 7/1993 | Frankeny et al. ........... 361/718 |
| 5,345,205 A | * | 9/1994 | Kornrumpf .................. 333/246 |
| 5,783,870 A | * | 7/1998 | Mostafazadeh et al. ..... 257/791 |
| 5,790,380 A | | 8/1998 | Frankeny |
| 5,805,422 A | * | 9/1998 | Otake .......................... 361/749 |
| 6,014,316 A | * | 1/2000 | Eide ............................ 361/735 |
| 6,061,245 A | * | 5/2000 | Ingraham et al. ........... 361/749 |
| 6,121,676 A | * | 9/2000 | Solberg ....................... 257/686 |
| 6,172,418 B1 | * | 1/2001 | Iwase .......................... 257/723 |
| 6,177,721 B1 | * | 1/2001 | Suh et al. .................... 257/686 |
| 6,208,521 B1 | * | 3/2001 | Nakatsuka .................. 361/749 |

FOREIGN PATENT DOCUMENTS

| JP | 9-275183 | | 10/1997 |
| JP | 10-242379 | | 9/1998 |
| JP | 10-335570 | | 12/1998 |
| JP | 2000216330 A | * | 8/2000 |

OTHER PUBLICATIONS

In-situ Multi-Step (IMS) CVD Process of (Ba,Sr) TiO$_3$ using Hot Wall Batch Type Reactor for DRAM Capacitor Dielectrics, M. Kiyotoshi et al.

* cited by examiner

Primary Examiner—Eddie Lee
Assistant Examiner—Chris Chu
(74) Attorney, Agent, or Firm—Katten, Muchin, Zavis, Rosenman (57) ABSTRACT

A semiconductor device of the present invention is made up of a semiconductor chip and a single wiring tape resembling a film carrier and including a wiring layer that has a preselected pattern. The wiring tape is adhered to at least the top, bottom and one side of a semiconductor chip. The semiconductor device has outer connecting portions arranged on the above surface of the chip. The semiconductor device is comparable in package size with a bare chip. A semiconductor module having a plurality of such semiconductor devices arranged bidimensionally or tridimensionally achieves desirable electric characteristics while obviating the dense arrangement of a number of wirings.

42 Claims, 8 Drawing Sheets

Circuit Patterning

*Fig. 7(c)* ⇩

Cover Resist Casting

*Fig. 7(d)* ⇩

Laser Drilling

Cu Plating (Inner)
Excimer 92

*Fig. 7(f)* ⇩

Au Plating (Inner) 93

*Fig. 7(g)* ⇩

Laser Drilling (Outer) 94

*Fig. 7(h)* ⇩

Au Plating (Outer) 95

Fig. 8

SEMICONDUCTOR DEVICE AND SEMICONDUCTOR MODULE USING THE SAME

BACKGROUND OF THE INVENTION

The present invention relates to a semiconductor device including a wiring tape, which is adhered to the periphery of a semiconductor chip, and comparable in package size with a bare chip, and a semiconductor module including a plurality of such semiconductor devices densely arranged bidimensionally or tridimensionally.

Today, a multichip module made up of a plurality of density arranged semiconductor devices is under development. Various package configurations and mounting methods have already been proposed in relation to a multichip module. Conventional structures that implement the dense arrangement of semiconductor devices may be classified into specific types that will be described hereinafter.

In one type of structure, semiconductor devices are monodimensionally stacked on a circuit board in the vertical direction. Japanese Patent Laid-Open Publication No. 9-275183, for example, teaches a semiconductor device having outer connecting portions arranged on the top and bottom thereof. This kind of semiconductor devices may be stacked in the monodimensional configuration.

In another type of structure, semiconductor devices are not only stacked in the vertical direction, but also arranged side by side in the horizontal direction, i.e., in parallel to a circuit board. More specifically, a plurality of stacks of semiconductor devices are arranged side by side in one direction parallel to a circuit board or arranged side by side in two directions parallel to a circuit board, but perpendicular to each other. Let the former structure and latter structure be referred to as a bidimensional structure and a tridimensional structure, respectively.

U.S. Pat. No. 5,790,380 discloses a semiconductor device having the bidimensional structure and including a single flexible wiring board. The flexible wiring board is attached to the top, bottom and one side of a semiconductor chip by being part. Outer connecting portions are arranged on the one side of the chip. Also disclosed in this document are a semiconductor module having a second flexible wiring board attached to a stack of such semiconductor devices and a semiconductor module having a third wiring board attached to a plurality of such modules.

Japanese Patent Laid-Open Publication No. 10-335570 proposes a semiconductor module having a plurality of semiconductor devices arranged in the tridimensional structure. Specifically, each semiconductor device includes a polygonal insulation package accommodating a semiconductor chip in a cavity formed thereinside. Outer connecting portions, which are implemented by pins, are arranged on each surface of the package. The chip and outer connecting portions are electrically interconnected via conductive leads and bonding wires. Such semiconductor devices are arranged tridimensionally.

However, the semiconductor device taught in the previously mentioned Laid-Open Publication No. 9-275183 has outer connecting portions arranged only on the top and bottom of the semiconductor chip and therefore implements only the monodimensional structure. Dense arrangement available with this structure is limited. Further, even if a plurality of stacks of such semiconductor devices are positioned side by side, the semiconductor devices adjoining each other in the horizontal direction cannot be electrically connected. For example, the top semiconductor devices of two modules adjoining each other in the horizontal direction cannot be electrically interconnected without the intermediary of underlying semiconductor devices and a circuit board. This aggravates electric characteristics and brings about the more dense arrangement of a greater number of wirings due to the increasing density. The dense arrangement of wirings translates into a decrease in the width of the individual wiring and a decrease in the distance between nearby wirings, which, in turn, obstruct the design and production of wirings and increase the cost.

The bidimensional structure disclosed in U.S. Pat. No. 5,790,380 needs the second and third flexible wiring boards in addition to the first flexible wiring board because outer connecting portions are arranged only on one side of the chip, lowering the mounting density. Moreover, semiconductor devices cannot be interconnected without the intermediary of the second and third wiring boards and circuit board. This also results in the problem stated above in relation to Laid-Open Publication No. 9-275183.

A problem with the tridimensional structure proposed in Laid-Open Publication No. 10-335570 is that the polygonal insulation package is a substantial thickness and has the semiconductor chip bonded within the cavity by wire bonding. The resulting package sizes is therefore far greater than the chip size and critically obstructs dense mounting. Further, two semiconductor devices adjoining each other via an intermediate semiconductor device cannot be electrically interconnected without the intermediary of a semiconductor chip included in the intermediate semiconductor device. This increases the length a signal transfer path between the semiconductor devices to be interconnected and increases the load on the circuit design of a semiconductor chip.

SUMMARY OF THE INVENTION

It is therefore an object of the present invention to provide, at a low cost, bidimensional or tridimensional semiconductor module exhibiting desirable electric characteristics without aggravating wiring density, and a semiconductor device comparable in package size with a bare chip for constricting the semiconductor module.

In accordance with the present invention, a semiconductor device includes a semiconductor chip and a single wiring tape including a wiring layer having a preselected pattern. Outer connecting portions are arranged on the wiring tape while inner connecting portions are formed in the wiring tape and connected to electrodes included in the semiconductor chip. The wiring tape is bent at the edges of the semiconductor chip and adhered to at least three surfaces of the semiconductor chip. The outer connecting portions are arranged on the above at least three surfaces.

A semiconductor module including a plurality of semiconductor devices each having the above configuration is also disclosed.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Preferred embodiments of the semiconductor device and semiconductor module in accordance with the present invention will be described hereinafter.

First Embodiment

Figure 1A:
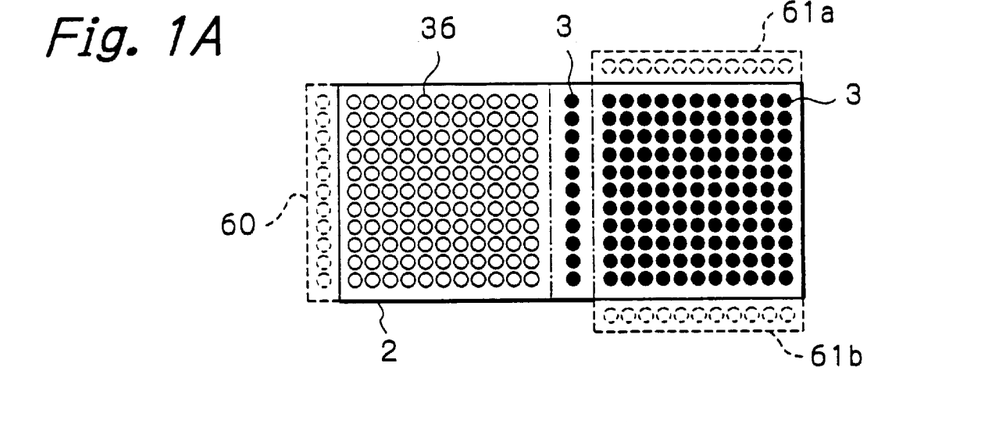
FIG. 1A is a plan view showing a first embodiment of the semiconductor device in accordance with the present invention being assembled.
Figure 1B:
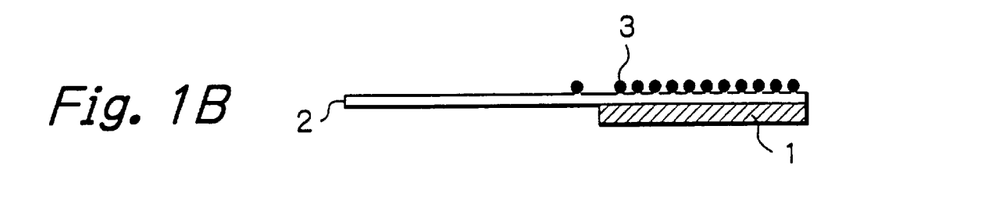
FIG. 1B is a front view of the first embodiment.
Figure 1C:
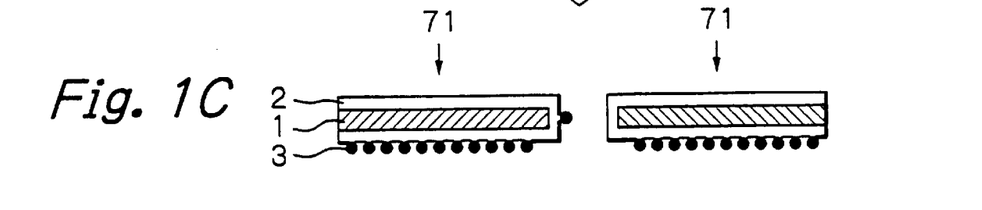
FIG. 1C is a front view showing the first embodiment in an assembled condition.

Referring to FIGS. 1A through 1D, a semiconductor device and a semiconductor module embodying the present invention are shown. As shown in FIGS. 1A through 1C, the semiconductor device, generally 71, is made up of a semiconductor chip 1 and a single wiring tape 2 resembling a film carrier. The semiconductor chip 1 is produced from a semiconductor wafer, not shown, and has a conventional rectangular shape. Specifically, the chip 1 has a top, a top, a bottom and four sides that form a rectangle. Each two contiguous surfaces of the chip 1 are substantially perpendicular to each other while each two surfaces of the same facing each other are substantially parallel to each other. More specifically, the top and bottom of the chip 1 are substantially parallel to each other while the front side and rear side and the right side and left side, as viewed in FIGS. 1A through 1D, each are parallel to each other.

A wiring layer, not shown, is formed in the wiring tape 2 in a preselected pattern. Preselected portions of the wiring layer are exposed to the outside on the surface of the wiring tape 2, forming outer connecting portions 36. The illustrative embodiment uses a BGA (Ball Grid Array). The outer connecting portions 36 are therefore implemented as lands to be loaded with solder balls 3. The wiring tape 2 is an extremely thin, flexible sheet having a contour corresponding to a rectangle that is formed when the top, bottom and one side of the chip 1 are developed.

A specific procedure for assembling the semiconductor device 71 will be described hereinafter. First, as shown in FIG. 1A, the solder balls 3 are bonded to the outer connecting portions 36 only in part of the wiring tape 2 that is to be adhered to the top and one side of the chip 1. That is, the solder balls 3 are absent in the other part of the wiring tape 2 that is to be adhered to the bottom of the chip 1. At the same time, a wiring tape 2 having solder balls 3 bonded to only part thereof that is to be adhered to the top of the chip 1 is prepared.

As shown in FIG. 1B, the wiring tape 2 with the solder balls 3 is adhered to the top of the chip 1. The wiring tape 2 is then bent at the edges of the chip 1 and closely adhered to one side and bottom of the chip 1, as shown in FIG. 1C. In the illustrative embodiment, adhesive is applied to the rear surface of the wiring tape 2 beforehand, so that the wiring tape 2 can be adhered to the chip 1.

As shown in FIG. 1C, the semiconductor device 71 assembled by the above procedure is made up of the chip 1 and a single wiring tape including a wiring layer. The wiring tape 2 has inner connecting portions in addition to the outer connecting portions 36. The inner connecting portions are implemented by metal 34 (see FIG. 5) connected to an electrode 5 (see FIG. 5), which is provided on the chip 1. The inner connecting portions are positioned in part of the wiring tape 2 to be adhered to the chip 1.

The wiring tape 2 is adhered to the top, bottom and one side oft he chip 1 by being part at the edges of the chip 1. The outer connecting portions 36 are positioned on all of the above three surfaces of the chip 1. Consequently, the outer connecting portions 36 are arranged on, among the top, bottom and one side of the chip 1 to which the wiring tape 2 is adhered, the top and bottom (a pair of surfaces facing each other) substantially parallel to each other.

Figure 1D:
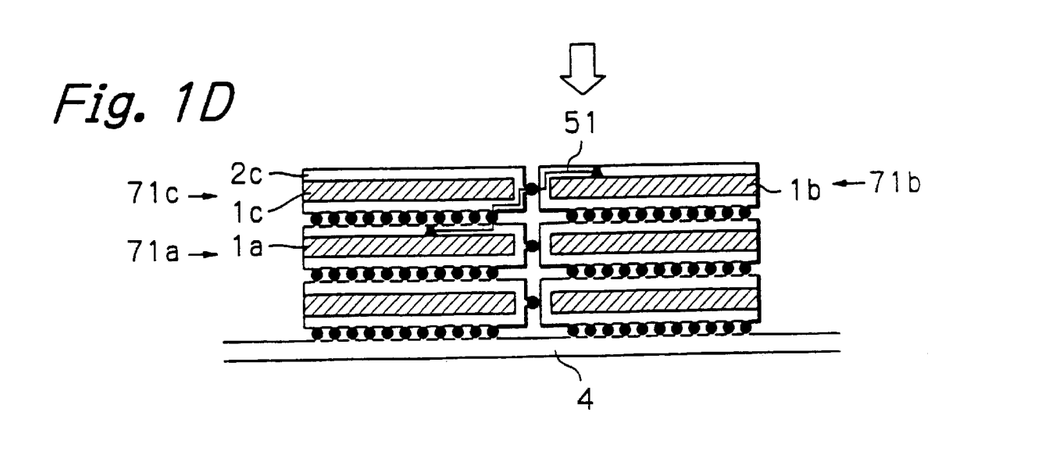
FIG. 1D is a front view of a semiconductor module including a plurality of semiconductor devices each having the configuration shown in FIG. 1C.

FIG. 1D shows a semiconductor module made up of a plurality of bidimensionally arranged semiconductor devices 71 each having the configuration shown in FIG. 1C. As shown, a plurality of semiconductor devices 71 are not only stacked on a circuit board 4, but also arranged side by side in the right-and-left direction. The solder balls 3 physically, electrically connect the semiconductor devices 71 adjoining each other in the vertical and horizontal directions. Also, the solder balls 3 physically, electrically connect the semiconductor devices 71 positioned at the bottoms of the stacks to the circuit board 4. In this condition, this semiconductor devices 71 adjoining each other are electrically connected via the outer connecting portions 36 of the wiring tape 2. In addition, the semiconductor devices 71 are connected together in the vertical direction (perpendicular to the circuit board 4) and horizontal direction (parallel to the circuit board 4) by the solder balls 3.

The semiconductor devices 71 can be stacked because the outer connecting portions 36 are positioned on, among the top, bottom and one side of each chip 1 to which the wiring tape 2 is adhered, the top and bottom that are substantially parallel to each other. While FIG. 1D shows the semiconductor devices 71 stacked in three steps, they may be stacked in four or more steps, as desired.

Further, two semiconductor devices 71 can be positioned side by side in the right-and-left direction because of the outer connecting portions 36 positioned on one side of each chip 1 to which the wiring tape 2 is also adhered.

As shown in FIG. 1A, the wiring tape 2 may be provided with an extension 60 (phantom line) that is to be adhered to the side of the chip 1 facing the above-described one side. This allows more semiconductor devices 71 to be arranged side by side in the right-and-left direction and physically, electrically interconnected via outer connecting portions, which are provided on the extension 60 also, and solder balls 3.

Figure 8:
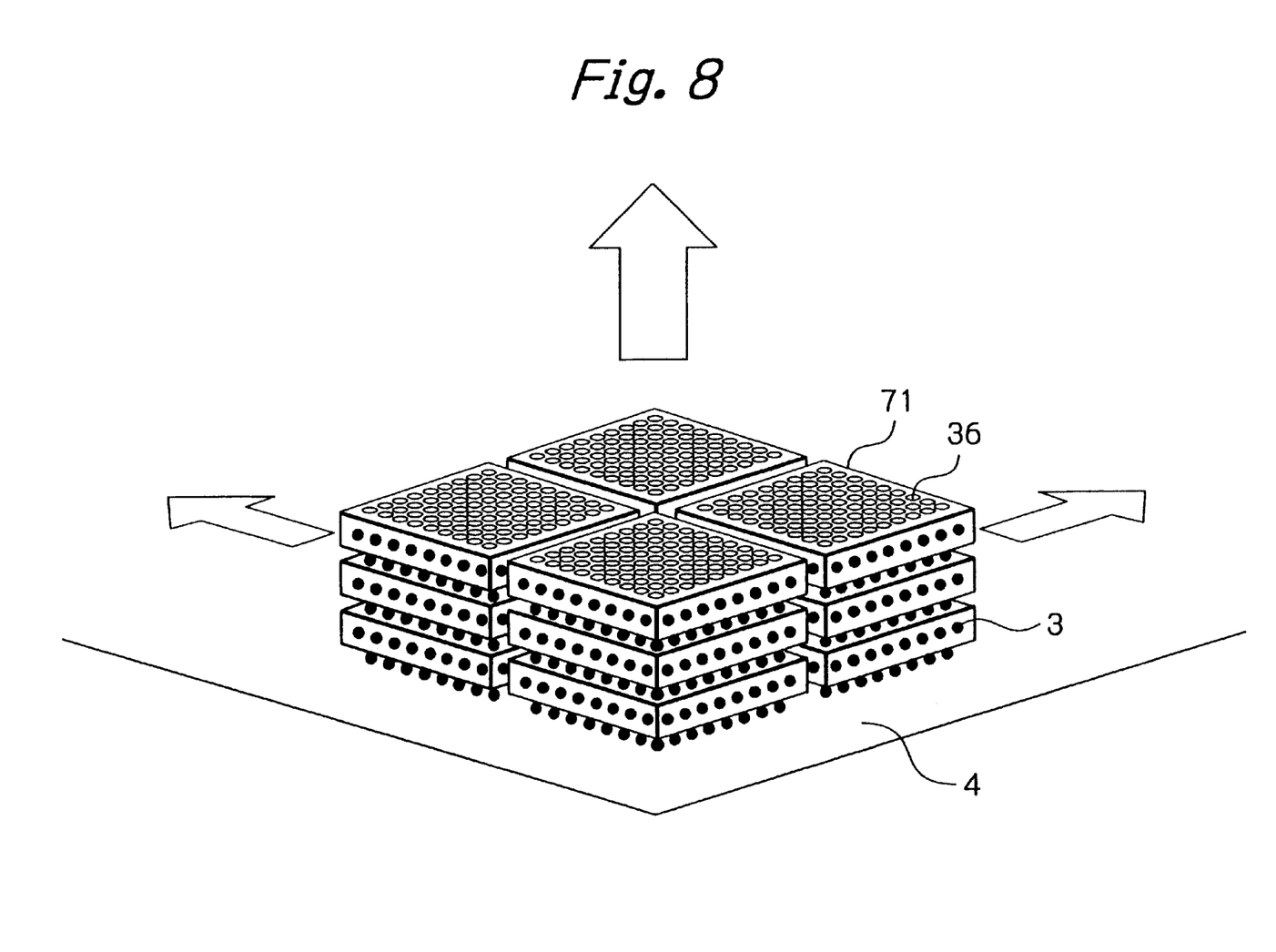
FIG. 8 is an isometric view showing a specific tridimensional semiconductor module available with the present invention.

As also shown in FIG. 1A, the wiring tape 2 may be additionally provided with extensions 61a and 61b (phantom line) that are to be respectively adhered to a pair of sides of the chip 1 facing each other i.e., the front side and rear side. This allows a number of semiconductor devices 71 to be arranged side by side on the circuit board 4 in the direction perpendicular to the sheet surface of FIG. 1D and physically, electrically connected via outer connecting portions, which are provided on the extensions 61a and 61b also, and solder balls 3. FIG. 8 shows a specific configuration of the resulting tridimensional semiconductor module. More semiconductor devices 71 may be arranged in the vertical and horizontal directions, as desired.

As stated above, in the illustrative embodiment, the outer connecting portions 36 and solder balls 3 physically, electrically connect nearby semiconductor devices 71. That is, each semiconductor device 71 can be electrically connected to another semiconductor device 71 without the intermediary of the circuit board 4 and therefore via the shortest possible route.

Moreover, as shown in FIG. 1D, the solder balls 3 and wiring tapes 2 cooperate to form, e.g., a wiring path 51 shown in FIG. 1D. The wiring path 51 electrically connect two semiconductor devices 71a and 71b via a wiring tape 2c adhered to a semiconductor chip 1c included in a semiconductor device 71c, which intervenes between the semiconductor devices 71a and 71b. That is, the semiconductor devices 71a and 71b are electrically interconnected without the intermediary of a semiconductor chip 1c included in the semiconductor device 71c.

Second Embodiment

Figure 2A:
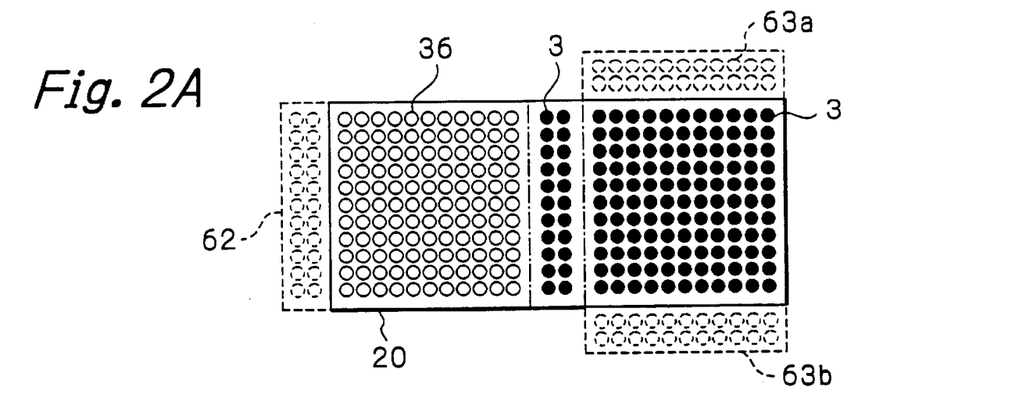
FIG. 2A is a plan view showing a second embodiment of the semiconductor device in accordance with the present invention being assembled.
Figure 2B:
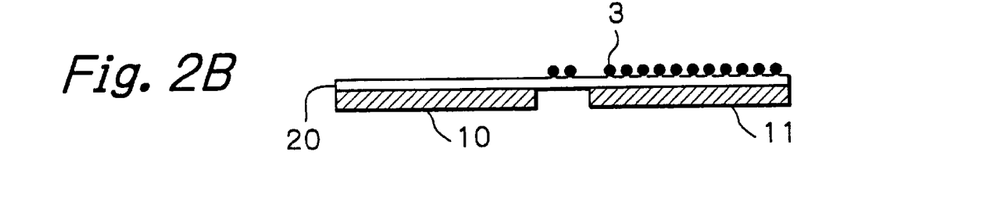
FIG. 2B is a front view of the second embodiment.
Figure 2C:
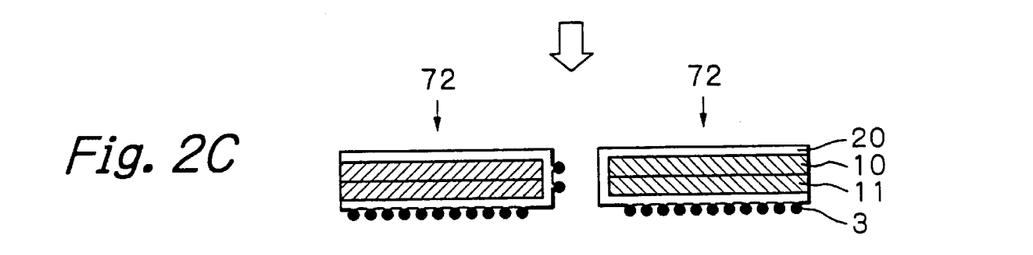
FIG. 2C is a front view of the second embodiment in an assembled condition.
Figure 2D:
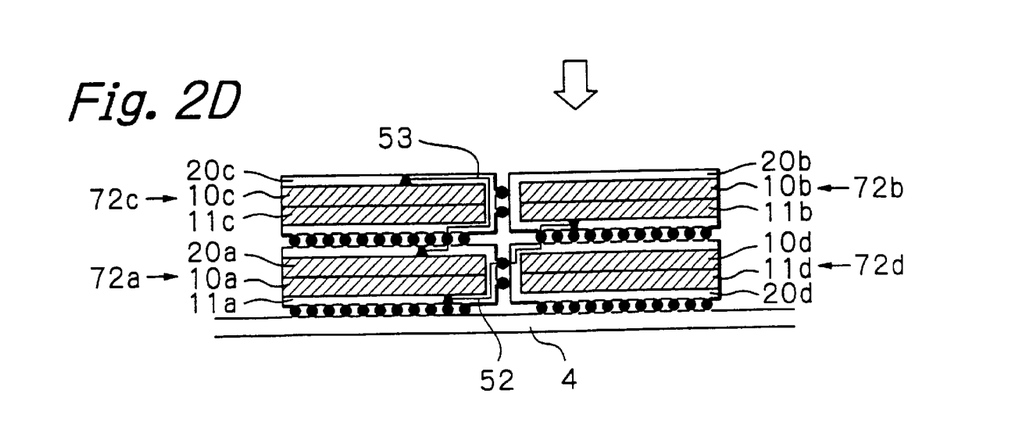
FIG. 2D is a front view of a semiconductor module including a plurality of semiconductor devices each having the configuration shown in FIG. 2C.

Reference will be made to FIGS. 2A through 2D for describing an alternative embodiment of the present invention. This embodiment is similar to the first embodiment except for the following configuration. As shown in FIGS. 2C and 2D corresponding to FIGS. 1C and 1D, respectively, each semiconductor device 72 has two semiconductor chips 10 and 11 adhered to each other at their rear surfaces in a double-chip fashion. Each wiring tape 20 therefore has a contour corresponding to a rectangle that is formed when the top, bottom and one side of the laminated of the chips 10 and 11 are developed. The wiring tape 20 differs from the wiring tape 20 of the previous embodiment in that it covers the above one side of the laminate of the chips 10 and 11.

A specific procedure for assembling the semiconductor device 72 and a semiconductor module will be described hereinafter. First, as shown in FIG. 2B, a single wiring tape 20 resembling a film carrier is adhered to the surfaces of the two chips 10 and 11. Subsequently, as shown in FIG. 2C, the wiring tape 20 is bent at the edges of the chips 10 and 11 and adhered to the sides of the chips 10 and 11. The chips 10 and 11 are adhered to each other at their rear surfaces.

As shown in FIG. 2D, a plurality of semiconductor devices 72 each having the configuration shown in FIG. 2C may be arranged bidimensionally in order to constitute a semiconductor module. Further, as shown in FIG. 2A, the wiring tape 20 may be provided with extensions 62, 63a and 63b (phantom line), so that the semiconductor devices 72 can be arranged in any other bidimensional configuration or in a tridimensional configuration similar to the configuration of FIG. 8.

In the illustrative embodiment, the solder balls 3 and wiring tapes 20 cooperate to form, e.g., a wiring path 53 shown in FIG. 2D. The wiring path 53 electrically connect two chips 10a and 10c via a wiring tape 20c adhered to a semiconductor chip 11c. which intervenes between the chips 10a and 10c. That is, the chips 10a and 10c are electrically interconnected without the intermediary of the chip 11c.

Third Embodiment

Another alternative embodiment of the present invention will be described with reference to FIGS. 3A through 3F. As shown, a semiconductor device 73 is made up of six semiconductor chips 12 through 17 and a single wiring tape 21 that resembles a film carrier. The chips 12 through 17 each are identical in configuration with the chip 1 of the first embodiment. In the illustrative embodiment, the wiring tape 21 has a length more than four times as great as the dimension of each of the chips 12 through 17.

A specific procedure for assembling the semiconductor device 73 will be described hereinafter. First, solder balls 3 are bonded to outer connecting portions 36 formed on the wiring tape 21, which is indicated by a solid line in FIG. 3A. More specifically, the solder balls 3 are bonded to part of the wiring tape 21 that is to be adhered to the front surface of the chip 12 and the sides of the chips 12 through 17. At the same time, a wiring tape 21 having solder balls 3 bonded only to part thereof to be adhered to the front surface of the chip 12 is prepared.

Figure 3A:
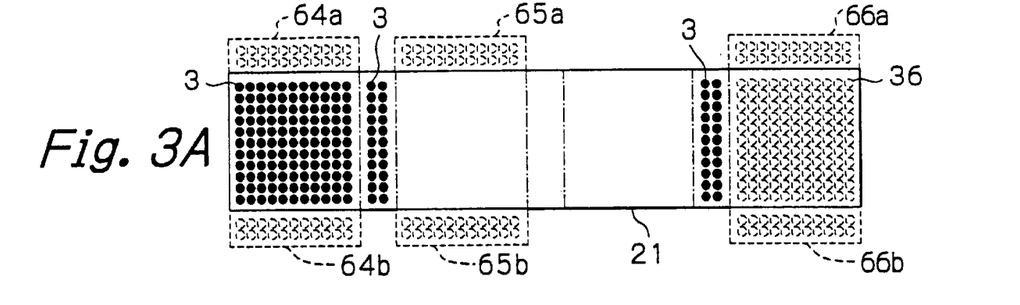
FIG. 3A is a plan view showing a wiring tape representative of a third embodiment of the semiconductor device in accordance with the present invention.
Figure 3B:
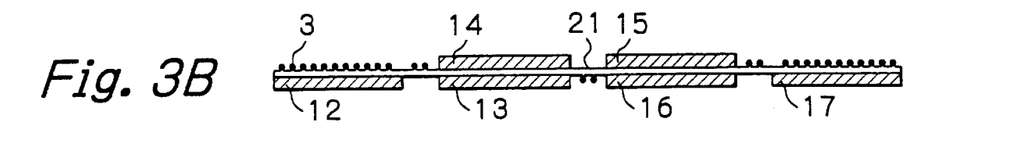
FIG. 3B is a front view of the third embodiment being assembled.
Figure 3C:
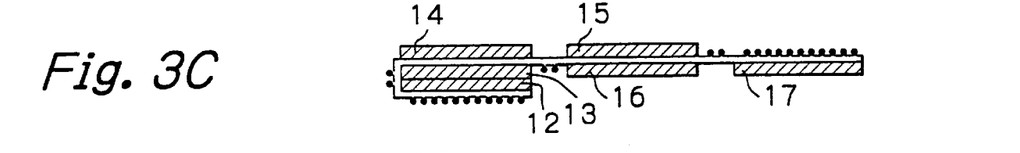
FIGS. 3C through 3D are front views each showing the third embodiment in a particular assembling step.

As shown in FIG. 3B, the front surfaces of the chips 12 and 17 are respectively adhered to the rear surface of the opposite end portions of the wiring tape 21 where the outer connecting portions are formed. The chips 13, 14, 15 and 16 are then adhered to the opposite surfaces of the intermediate portion of the wiring tape 21 at front surfaces thereof. Subsequently, as shown in FIG. 3C, the wiring tape 21 is bent at the edges of the chips 12 and 13 and adhered to the sides of the chips 12 and 13. Also, the rear surfaces of the chips 12 and 13 are adhered to each other.

Figure 3D:
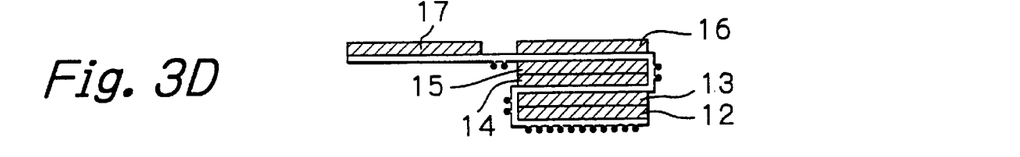
Figure 3E:
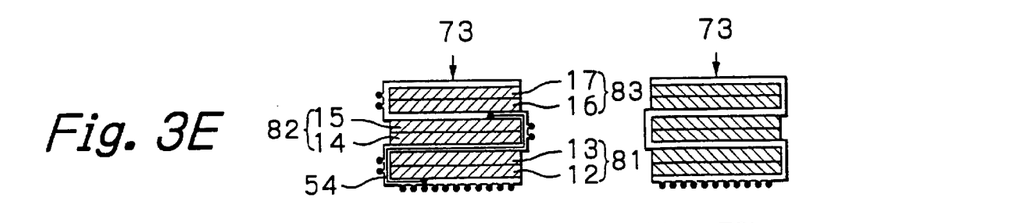
FIG. 3E is a front view of the third embodiment in an assembled condition.

As shown in FIG. 3D, the wiring tape 21 is then bent at the edges of the chips 14 and 15 and adhered to the sides of the chips 14 and 15. At the same time, the rear surfaces of the chips 14 and 15 are adhered to each other. Further, as shown in FIG. 3E, the wiring tape 21 is bent at the edges of the chips 16 and 17 and adhered to the sides of the chips 16 and 17. Also, the rear surfaces of the chips 16 and 17 are adhered to each other.

As shown in FIG. 3E, the semiconductor device 73 has three pairs of semiconductor chips; the chips in each pair are adhered together at their rear surfaces. Specifically, the chips 12 and 13, chips 14 and 15 and chips 16 and 17 are combined to constitute three double-chips 81, 82 and 83, respectively.

In the illustrative embodiment, the wiring tape 21 has inner connecting portions having a preselected pattern in addition to the outer connecting portions 36. The inner connecting portions are implemented by metal 44, 44b and 44c (see FIG. 6) respectively connected to electrodes 5a, 5b and 5c (see FIG. 6), which are provided on the chip. The inner connecting portions are positioned on part of the wiring tape 21 to be adhered to the chip.

Two double-chips 81 and 82 (or 82 and 83) facing each other at one surface thereof contact each other with the intermediary of the wiring tape 21. Part of the wiring tape 21, which is contiguous with part of the same intervening between the chips is bent at the edges of the chips and adhered to the outer surfaces of the chips. The other surfaces refer to the bottom and left side of the double chip 81, the right side of the double-chip 82, and the top and left side of the double-chip 83. The outer connecting portions 36 are positioned on each of the above surfaces, i.e., two pairs of substantially parallel surfaces included in the surfaces to which the wiring tape 21 is adhered. The two pairs of substantially parallel surfaces are the top and bottom of the semiconductor device 73 and the right side and left side of the semiconductor device 73.

Figure 3F:
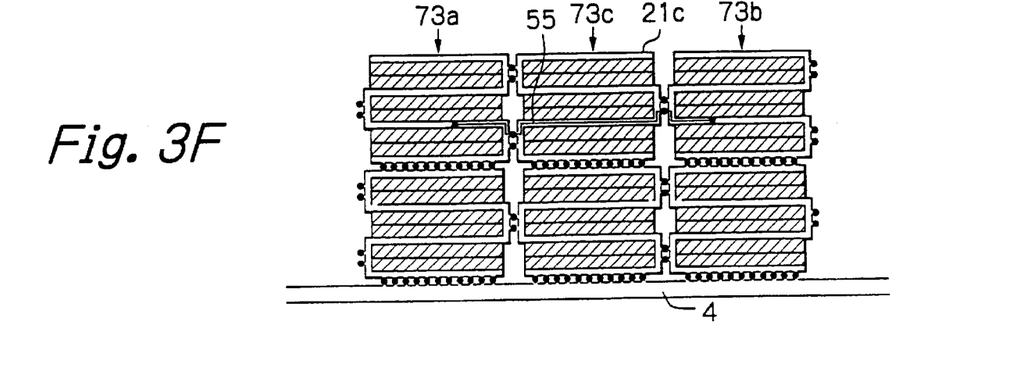
FIG. 3F is a front view of a semiconductor module including a plurality of semiconductor devices each having the configuration shown in FIG. 3E.

FIG. 3F shows a semiconductor module made up of a plurality of bidimensionally arranged semiconductor devices 73 each having the configuration shown in FIG. 3E. As shown, the semiconductor devices 73 are stacked on a circuit board 4 and arranged side by side in the right-and-left direction. The solder balls 3 physically, electrically connect the semiconductor devices 73 adjoining in the vertical and horizontal directions. Also, the solder balls 3 physically, electrically connect the semiconductor devices 71 positioned at the bottoms of the stacks to the circuit board 4. In this condition, the semiconductor devices 73 adjoining each other are electrically connected via the outer connecting portions 36 of the wiring tapes 21. In addition, the semiconductor devices 73 are connected together in the vertical direction (perpendicular to the circuit board 4) and horizontal direction (parallel to the circuit board 4) by the solder balls 3.

The semiconductor devices 73 can be stacked because the outer connecting portions 36 are positioned on the top and bottom that are substantially parallel to each other. While FIG. 3F shows the semiconductor devices 73 stacked in two steps, they may be stacked in three or more steps, as desired.

Further, a number of semiconductor devices 73 can be positioned side by side in the right-and-left direction because of the outer connecting portions 36 positioned the right side and left side, which are substantially parallel to each other. While FIG. 3 shows three semiconductor devices 73 arranged side by side, four or more semiconductor devices 73 may be arranged side by side.

As shown in FIG. 3A, the wiring tape 2 may be provided with some or all of extensions 64a, 64b, 65a, 65b, 66a and 66b (phantom line) that are to be adhered to the sides of the double-chips 81 through 83 facing each other, i.e., front sides and rear sides. This allows a number of semiconductor devices 73 to be arranged in the direction perpendicular to the sheet surface of FIG. 3F and physically, electrically connected via outer connecting portions, which are provided on the extensions 64a through 66b also, and solder balls 3. The resulting semiconductor module has a tridimensional configuration similar to the configuration of FIG. 8.

As stated above, in the illustrative embodiment, the outer connecting portions 36 and solder balls 3 physically, electrically connect nearby semiconductor devices 73. That is, each semiconductor device 73 can be electrically connected to another semiconductor device 73 without the intermediary of the circuit board 4 and therefore via the shortest possible route.

Further, as shown in FIG. 3E, the solder balls 3 and wiring tape 2 cooperate to form, e.g., a wiring path 54. The wiring path 54 electrically connects two semiconductor devices 12 and 15 via the wiring tape 21 adhered to semiconductor chips 13 and 14, which intervene between the semiconductor devices 12 and 15. That is, the semiconductor devices 12 and 15 are electrically interconnected without the intermediary of the chips 13 and 14.

Moreover, as shown in FIG. 3F, the solder balls 3 and wiring tape 2 cooperate to form, e.g., a wiring path 55. The wiring path 55 electrically connects two semiconductor devices 73a and 73b via a wiring tape 21c included in a semiconductor device 73c, which intervenes between the semiconductor devices 73a and 73b. That is, the semiconductor devices 73a and 73b are electrically interconnected without the intermediary of the chips of the semiconductor device 73c.

The double-chips 81, 82 and 83 each may be replaced with a single chip, in which case each semiconductor device 73 will not be provided with the three chips 13, 14 (or 15) and 16 and will be assembled in the manner described above.

Fourth Embodiment

Figure 4A:
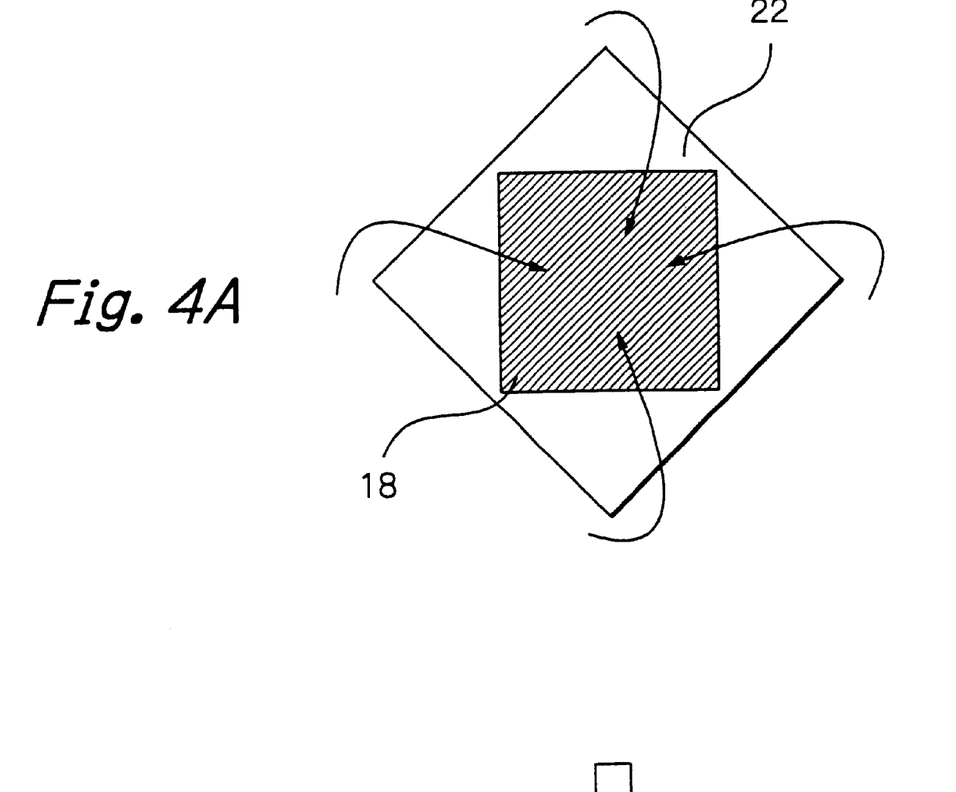
FIG. 4A is a plan view showing a fourth embodiment of the semiconductor device in accordance with the present invention being assembled.
Figure 4B:
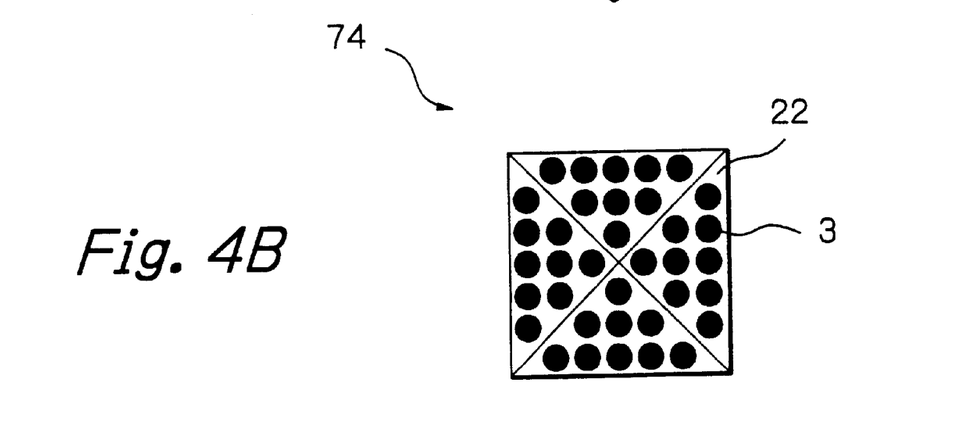
FIG. 4B is a plan view showing the fourth embodiment in an assembled condition.

Referring to FIGS. 4A and 4B, a further alternative embodiment of the present invention is shown. As shown, a semiconductor device 74 is made up of a semiconductor chip 18 and a wiring tape 22 resembling a film carrier. The chip 18 is identical in configuration with the chip 1 of the first embodiment. In the illustrative embodiment, the wiring tape 22 has a rectangular configuration dimensioned slightly greater than the length of the diagonal line of the chip 18 in the vertical and horizontal directions.

A specific procedure for assembling the semiconductor device 74 will be described hereinafter. First, solder balls 3 are bonded to the front surface of the wiring tape 22. Subsequently, the front surface of the chip 18 is adhered to the center of the rear surface of the wiring tape 22. At this instant, as shown in FIG. 4A, the chip 18 is positioned such that four sides thereof are inclined by 45° relative to the sides of the wiring tape 22. Thereafter, the wiring tape 22 is folded down at the edges of the chip 18 in such a manner as to cover the entire periphery of the chip 18, i.e., four sides and rear surface of the chip 18 and then adhered to the chip 18. As shown in FIG. 4B, the four corners of the wiring tape 22 greater at the center of the rear surface of the tape 22.

In the illustrative embodiment, the wiring tape 22 is adhered to all of six surfaces of the chip 18. The outer connecting portions 36 are positioned on three or more of the six surfaces of the chip 18. This allows a plurality of semiconductor devices 74 to be arranged bidimensionally or tridimensionally in the same manner as in the first embodiment.

The wiring tape 22, which is adhered to all of the six surfaces of the chip 18, has a rectangular contour and therefore needs a minimum amount of material. In addition, such a contour promotes efficient wiring design. The chip 18 may be replaced with two chips adhered to each other at their rear surfaces, if desired.

Figure 5:
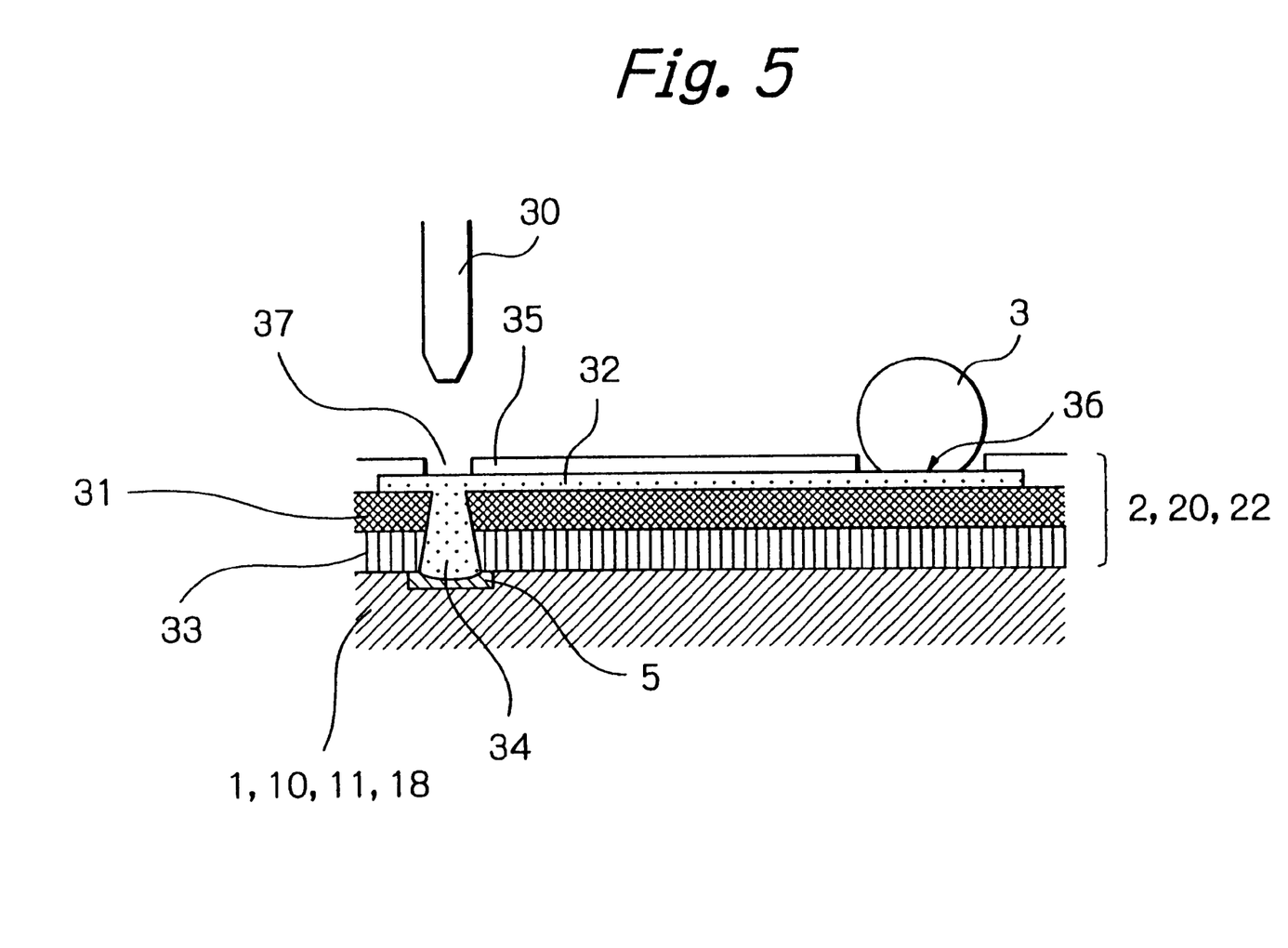
FIG. 5 is a fragmentary section showing a specific structure including a semiconductor chip and a wiring tape adhered to the chip.

Reference will be made to FIG. 5 for describing a specific structure of each of the semiconductor devices 71, 72 and 74 of the first, second and fourth embodiments. As shown, the wiring tape 2, 20 or 22 is a laminate of an insulation film 31, a wiring layer 32, an adhesive layer 33, buried metal 34, and a cover coat 35. The wiring layer 32 is formed on one surface of the insulation film 31 in a preselected pattern by lithography. The cover coat or insulator 35 covers the above surface of the insulation film 31. The cover coat 35 is open at each land portion of the wiring layer 32 in order to implement the outer connecting portion 36. The solder ball 3 is bonded to the outer connecting portion 36. The adhesive layer 33 is formed on the other surface of the insulation film 31.

The wiring tape 2, 20 or 22 is adhered to the semiconductor chip 1, 10, 11 or 18 via the adhesive layer 33. The metal 34, playing the role of the inner connecting portion, is buried in aligned holes formed in part of the insulation film 31 and adhesive layer 33 that faces an electrode 5 included in the chip. The metal 34 is connected to the wiring layer 32 at one end and conjnected to the electrode 5 at the other end. The cover coat 35 is formed with a hole 37 above the metal 34. To connect the electrode 5 and metal 34, a bonding tool 30 presses part of the wiring layer 32 overlying the metal 34 via the hole 37 for thereby bonding the metal 34 to the electrode 5.

Figure 6:
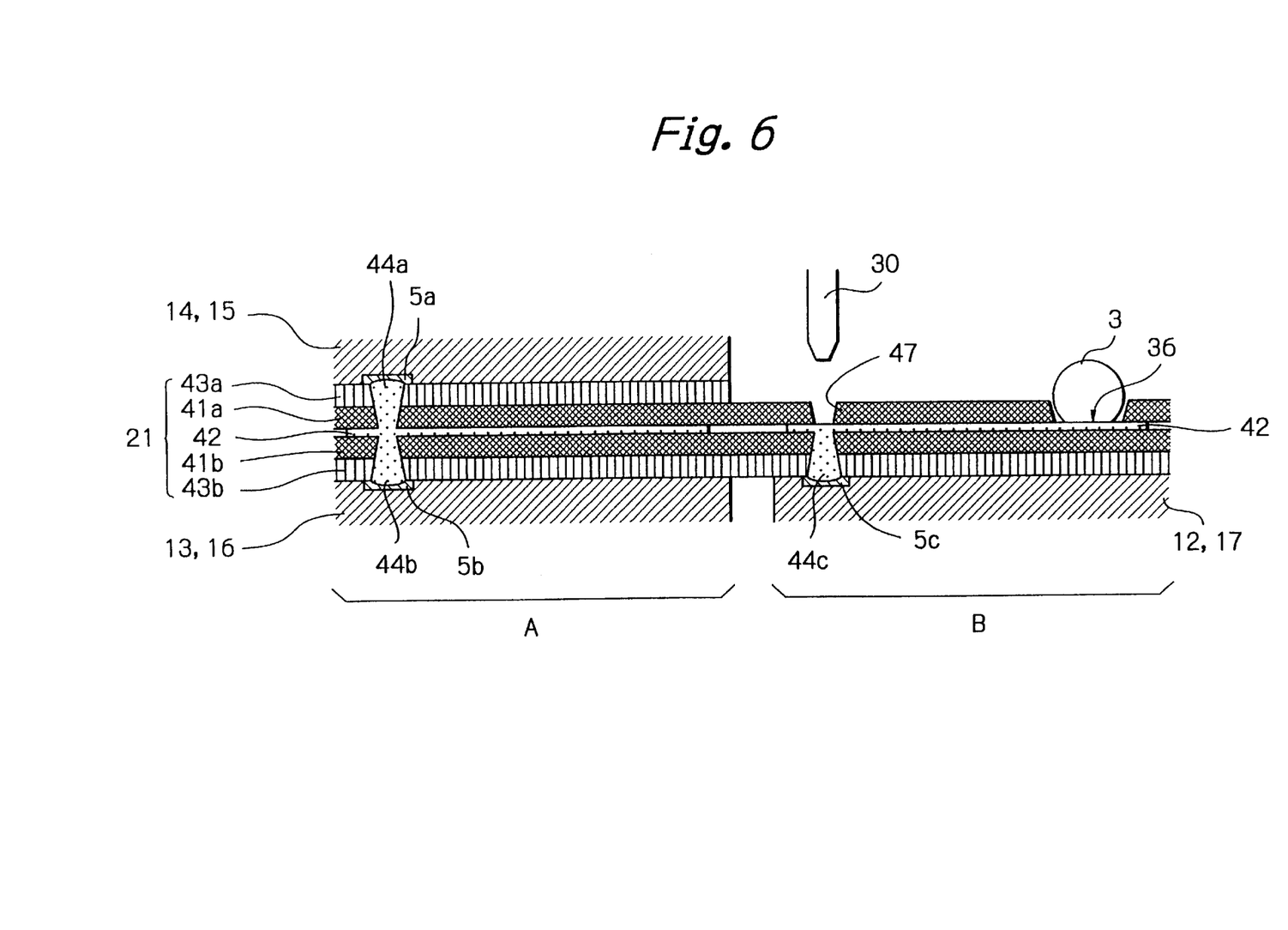
FIG. 6 is a fragmentary section showing another specific structure including a wiring tape and semiconductor chips adhered thereto.
Figure 7A:
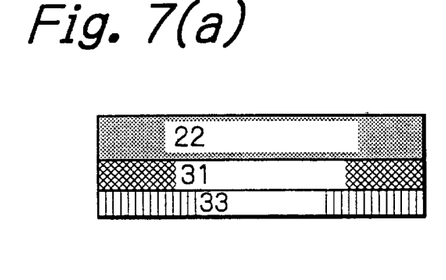
FIG. 7 is a section showing a specific procedure for producing the wiring tape.
Figure 7B:
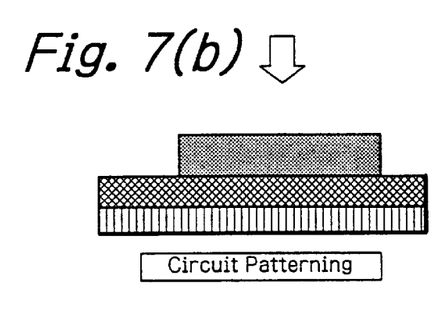
Figure 7C:
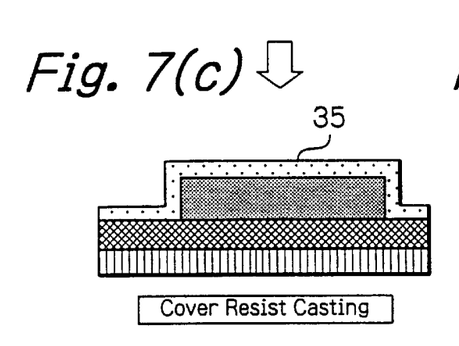
Figure 7D:
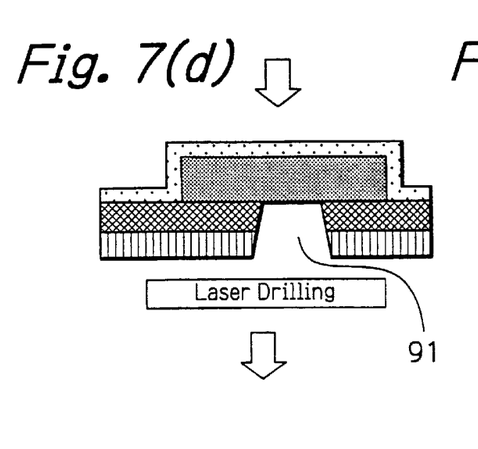
Figure 7E:
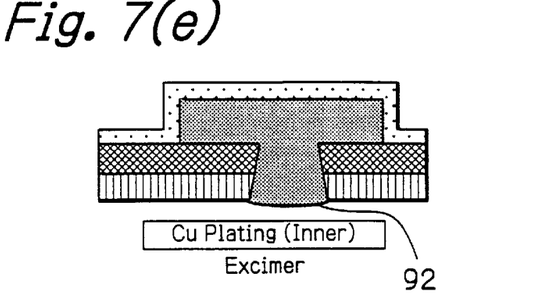
Figure 7F:
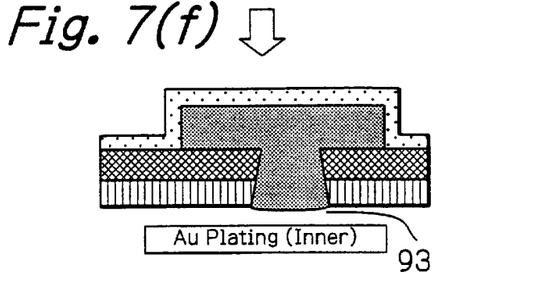
Figure 7G:
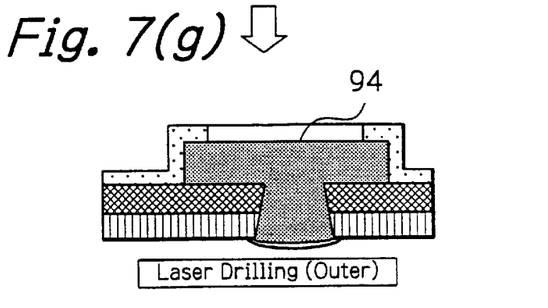
Figure 7H:
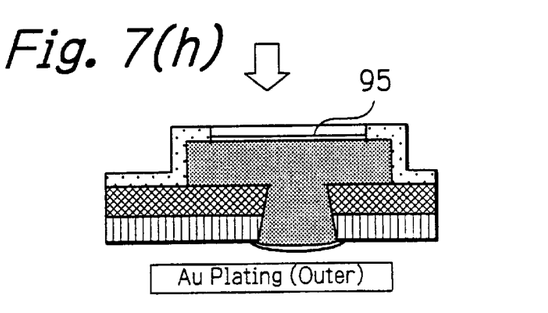

FIG. 6 shows a specific structure of the semiconductor device 73 of the third embodiment. As shown, the wiring tape 21 is a laminate of two insulation films 41a and 41b, a wiring layer 42, two adhesive layers 43a and 43b, and buried metals 44a, 44b and 44c. The wiring layer 42 intervenes between the insulation films 41a and 41b and has a preselected wiring pattern. The wiring layer 42 is formed on one surface of the insulation film 41b by lithography. Subsequently, the insulation film 41a is formed on the above surface of the insulation film 41b. In a portion 8 where a chip is to be mounted on one surface of the wiring tape 21, the insulation film 42 is formed with a hole at a land portion by etching, punching, laser drilling or similar technology, forming the outer connecting portion 36. The solder ball 3 is bonded to the outer connecting portion 36.

In a portion A where chips are to be mounted on both surfaces of the wiring tape 21, the adhesive layer 43a is formed on the surface of the insulation film 41a opposite to the surface where the wiring layer 42 is formed. The chip 14 or 15 is adhered to the wiring tapes 21 via the adhesive layer 43a. The metal 44a is buried in aligned holes formed in the insulation film 41a and adhesive layer 43a at a position where it faces an electrode 5a included in the chip 14 or 15. The metal 44a is connected to the wiring layer 42 at one end and connected to the electrode 5a at the other end.

Likewise, in the portion A, the adhesive layer 43b is formed on the surface of the insulation film 41b opposite to the surface where the wiring layer 42 is formed. The chip 13 or 16 is adhered to the wiring tape 21 via the adhesive layer 43b. The metal 44b is buried in aligned holes formed in the insulation film 41b and adhesive layer 43b at a position where it faces an electrode 5b included in the chip 13 or 16. The metal 44b is connected to the wiring layer 42 at one end and connected to the electrode 5b at the other end.

To connect the electrodes 5a and 5b to the metals 44a and 44b, respectively, the rear surface of the chip 14 or 15 and that of the chip 13 or 16 are pressed to, in turn, press the wiring tape 21 therebetween. As a result, the metals 44a and 44b are bonded to the electrodes 5a and 5b, respectively.

In the portion B, the adhesive layer 43b is formed on the surface of the insulation film 41b opposite to the wiring layer 42. The wiring tape 21 and chip 12 or 17 are connected together by the adhesive layer 43b. The metal 44c is buried in aligned holes formed in the insulation film 41b and adhesive layer 43b at a position where it faces an electrode 5c included in the chip 12 or 17. The metal 44c is connected to the wiring layer 42 at one end and connected to the electrode 5c at the other end. A hole 47 is formed in the wiring film 41a above the metal 44c. To connect the electrode 5c and metal 44c, a bonding tool 30 presses part of the wiring layer 42 positioned above the metal 44c exposed to the outside via the hole 47.

In the configuration shown in FIG. 6, the insulation films 41a and 41b are formed of, e.g., polyimide while the wiring layers 42 is implemented by, e.g., copper foil. Such materials are, however, only illustrative and may be replaced with any other suitable materials.

FIG. 7 shows a specific procedure for forming any one of the wiring tapes 2, 20 and 22. As shown in FIG. 7, (a), the wiring layer 32 of copper is formed on one surface of the insulation film 31 formed of polyimide. Adhesive is coated on the other surface of the wiring film 31, forming the adhesive layer 33. The insulation film 31 is about 12 $\mu$m thick. The wiring layer 32 is about 18 $\mu$m thick. Further, the adhesive layer 33 is about 10 $\mu$m thick.

Subsequently, as shown in FIG. 7, (b), the wiring layer 32 is selectively etched to form a wiring pattern (circuit patterning). As shown in FIG. 7, (c), the surface of the wiring layer 32 where the wiring pattern is present is coated with the cover coat 35 (cover resist casting). As shown in FIG. 7, (d), a hole 91 is formed throughout the adhesive layer 33 and insulation film 31 from the side opposite to the wiring layer 32 (laser drilling), so that the wiring layer 32 is exposed to the outside via the hole 91.

As shown in FIG. 7, (e), copper (Cu) 92 is buried in the hole 91 in such a manner as to slightly protrude from the surface of the adhesive layer 33 (inner Cu plating using an excimer laser). As shown in FIG. 7, (f), gold (Au) is plated on the surface of the copper 92 that protrudes from the above surface of the adhesive layer 33 (inner Au plating), thereby coating copper 92. As shown in FIG. 7, (g), part of the cover coat 35 covering a land portion 94, which is included in the wiring layer 32, is removed by etching (outer laser drilling), so that the land portion 94 is exposed to the outside. Finally, as shown in FIG. 7, (h), gold 95 is plated on the land portion 94 so as to cover it (outer Au plating).

By the procedure shown in FIG. 7, the wiring tape 2, 20 or 22 is formed. As for the wiring tape 21, the cover resist casting step of FIG. 7, (c), is replaced with a step of forming the insulation film 41a and a step of forming the adhesive layer 43a.

In the illustrative embodiments shown and described, a wiring layer is partly exposed to the outside to form a land that plays the role of the outer connecting portion of the wiring tape. A solder ball is bonded to the land in order to connect semiconductor devices to each other. The solder ball may be replaced with any other suitable metal bump or even with a conductive projection contiguous with the wiring layer, if desired. Also, metal buried in the wiring tape to serve as an inner connecting portion may be omitted, in which case the wiring layer will be directly bonded to the electrode of a semiconductor chip.

In summary, it will be seen that the present invention provides a semiconductor device and a semiconductor module having various unprecedented advantages, as enumerated below.

(1) A single wiring tape is adhered to three or more surfaces of a semiconductor chip, providing the semiconductor device with a package size comparable with a bare chip size. This successfully avoids the dense arrangement of a number of wirings.

(2) Outer connecting portions are positioned on three or more surfaces of a semiconductor chip, so that a bidimensional or tridimensional, dense semiconductor module is achieved.

(3) The wiring tape allows the chips of the semiconductor module to be electrically interconnected via a relatively short route, avoiding the dense arrangement of a number of wirings on the wiring tape as well as on a circuit board. This allows the width of the individual wiring and the distance between nearby wirings to be increased and thereby reduces the mounting cost of the wiring tape and circuit board.

(4) Consequently, the bidimensional or tridimensional semiconductor module achieves desirable electric characteristics. In addition, such a semiconductor module and the semiconductor device as small as a bare chip can be produced at low cost.

(5) Various modifications will become possible for those skilled in the art after receiving the teachings of the present disclosure without departing from the scope thereof.

What is claimed is:

1. A semiconductor device comprising:
   a semiconductor chip;
   a single wiring tape including a wiring layer having a preselected pattern, a single insulation layer, and an adhesive layer, said single insulation layer being disposed between said wiring layer and said adhesive layer;
   outer connecting portions arranged on said wiring tape; and
   inner connecting portions formed in said wiring tape and connected to electrodes included in said semiconductor chip;
   wherein said wiring tape is bent at edges of said semiconductor chip and adhered to at least three surfaces of said semiconductor chip, said outer connecting portions being arranged on said at least three surfaces.

2. A semiconductor device as claimed in claim 1, wherein said outer connecting portions are arranged on, among said at least three surfaces, a pair of surfaces facing each other.

3. A semiconductor device as claimed in claim 1, wherein said outer connecting portions are arranged on, among said at least three surface, two pairs of surfaces facing each other.

4. A semiconductor device as claimed in claim 1, wherein said outer connecting portions are arranged on, among said at least three surface, three pairs of surfaces facing each other.

5. A semiconductor device as claimed in claim 1, wherein said semiconductor chip comprises two semiconductor chips adhered to each other at rear surfaces thereof.

6. In a semiconductor module comprising a plurality of semiconductor devices, said plurality of semiconductor devices each comprise:
   a semiconductor chip; and
   a single wiring tape comprising a wiring layer having a preselected pattern, a single insulation layer and an adhesive layer, said single insulation layer being disposed between said wiring layer and said adhesive layer, outer connecting portions arranged on said wiring tape, and inner connecting portions formed in said wiring tape and connected to electrodes included in said semiconductor chip;
   said wiring tape is bent at edges of said semiconductor chip and adhered to at least three surfaces of said semiconductor chip, said outer connecting portions being arranged on said at least three surfaces; and
   said plurality of semiconductor devices are not only stacked, but also arranged side by side, said plurality of semiconductor devices being electrically interconnected via said outer connecting portions.

7. A semiconductor module as claimed in claim 6, wherein each two semiconductor devices are electrically connectable via said wiring tape that belongs to a semiconductor device intervening between said two semiconductor devices.

8. A semiconductor module as claimed in claim 6, wherein each two semiconductor chips are electrically connectable via said wiring tape that is adhered to a semiconductor chip intervening between said two semiconductor chips.

9. In a semiconductor module comprising a plurality of bidimensionally arranged semiconductor devices, said plurality of semiconductor devices each comprise:
   a semiconductor chip; and
   single wiring tape comprising a wiring layer having a preselected pattern, a single insulation layer, and an adhesive layer, said single insulation layer being disposed between said wire layer and said adhesive layer, outer connecting portions arranged on said wiring tape, and inner connecting portions formed in said wiring tape and connected to electrodes included in said semiconductor chip; and
   said wiring is bent at edges of said semiconductor chip and adhered to at least three surfaces of said semiconductor chip, said outer connecting portions being arranged on said at least three surfaces.

10. A semiconductor module as claimed in claim 9, wherein each two semiconductor devices are electrically connectable via said wiring tape that belongs to a semiconductor device intervening between said two semiconductor devices.

11. A semiconductor module as claimed in claim 9, wherein each two semiconductor chips are electrically connectable via said wiring tape that is adhered to a semiconductor chip intervening between said two semiconductor chips.

12. In a semiconductor module comprising a plurality of tridimensionally arranged semiconductor devices, said plurality of semiconductor devices each comprise:
   a semiconductor chip; and
   a single wiring tape comprising a wiring layer having a preselected pattern, a single insulation layer, and an adhesive layer, said single insulation layer being disposed between said wire layer and said adhesive layer, outer connecting portions arranged on said wiring tape, and inner connecting portions formed in said wiring tape and connected to electrodes included in said semiconductor chip; and
   said wiring tape is bent at edges of said semiconductor chip and adhered to at least three surfaces of said semiconductor chip, said outer connecting portions being arranged on said at least three surfaces.

13. A semiconductor module as claimed in claim 12, wherein each two semiconductor devices are electrically connectable via said wiring tape that belongs to a semiconductor device intervening between said two semiconductor devices.

14. A semiconductor module as claimed in claim 12, wherein each two semiconductor chips are electrically connectable via said wiring tape that is adhered to a semiconductor chip intervening between said two semiconductor chips.

15. A semiconductor device comprising:
   at least two semiconductor chips:

a single wiring tape including a wiring layer having a preselected pattern, at least one insulation layer, and at least one adhesive layer, an insulation layer of said at least one insulation layer being disposed between an adhesive layer of said at least one adhesive layer and said wiring layer, an adhesive layer of said one adhesive layer occupying an area with boundaries collinear with boundaries of an area occupied by said wiring layer;

outer connecting portions arranged on said wiring tape; and inner connecting portions formed in said wiring tape; and connected to electrodes included in each of said at least two semiconductor chips;

wherein two semiconductor chips, which face each other at one surface thereof, are interconnected by said wiring tape, and wherein part of said wiring tape contiguous with part intervening between said two semiconductor chips is bent at edges of said two semiconductor chips and adhered to other surfaces of said two semiconductor chips.

16. A semiconductor device as claimed in claim 15, wherein said outer connecting portions are arranged on, among said at least three surfaces, a pair of surfaces facing each other.

17. A semiconductor device as claimed in claim 15, wherein said outer connecting portions are arranged on, among said at least three surfaces, two pairs of surfaces facing each other.

18. A semiconductor device as claimed in claim 15, wherein said outer connecting portions are arranged on, among said at least three surfaces, three pairs of surfaces facing each other.

19. A semiconductor device as claimed in claim 15, wherein said semiconductor chip comprises two semiconductor chips adhered to each other at rear surfaces thereof.

20. In a semiconductor module comprising a plurality of semiconductor devices, said plurality of semiconductor devices each comprise:

at least two semiconductor chips;

a single wiring tape including a wiring layer having a preselected pattern, at least one insulation layer, and at least one adhesive layer, an insulation layer of said at least one insulation layer being disposed between an adhesive layer of said at least one adhesive layer and said wiring layer, an adhesive layer of said at least one adhesive layer occupying an area with boundaries collinear with boundaries of an area occupied by said wiring layer;

outer connecting portions arranged on said wiring tape; and inner connection portions formed in said wiring tape and connected to electrodes included in each of said at least two semiconductor chips:

two semiconductor chips, which face each other at one surface thereof, are interconnected by said wiring tape;

part of said wiring tape contiguous with part intervening between said two semiconductor chips is bent at edges of said two semiconductor chips and adhered to other surfaces of said two semiconductor chips; and said plurality of semiconductor devices are not only stacked, but also arranged side by side, said plurality of semiconductor devices being electrically interconnected via said outer connecting portions.

21. A semiconductor module as claimed in claim 20, wherein each two semiconductor devices are electrically connectable via said wiring tape that belongs to a semiconductor device intervening between said two semiconductor devices.

22. A semiconductor module as claimed in claim 20, wherein each two semiconductor chips are electrically connectable via said wiring tape that is adhered to a semiconductor chip intervening between said two semiconductor chips.

23. In a semiconductor module comprising a plurality of bidimensionally arranged semiconductor devices, said plurality of semiconductor devices each comprise:

at least two semiconductor chips;

a single wiring tape including a wiring layer having a preselected pattern, at least one insulation layer, and at least one adhesive layer, an insulation layer of said at least one insulation layer being disposed between an adhesive layer of said at least one adhesive layer and said wiring layer, an adhesive layer of said at least one adhesive layer occupying an area with boundaries collinear with boundaries of an area occupied by said wiring layer;

outer connecting portions arranged on said wiring tape; and inner connecting portions formed in said wiring tape and connected to electrodes included in each of said at least two semiconductor chips;

two semiconductor chips, which face each other at one surface thereof, are interconnected by said wiring tape; and part of said wiring tape contiguous with part intervening between said two semiconductor chips is bent at edges of said two semiconductor chips and adhered to other surfaces of said two semiconductor chips.

24. A semiconductor module as claimed in claim 23, wherein each two semiconductor devices are electrically connectable via said wiring tape that belongs to a semiconductor device intervening between said two semiconductor devices.

25. A semiconductor module as claimed in claim 23, wherein each two semiconductor chips are electrically connectable via said wiring tape that is adhered to a semiconductor chip intervening between said tow semiconductor chips.

26. In a semiconductor module comprising a plurality of tridimensionally arranged semiconductor devices, said plurality of semiconductor devices each comprise:

at least two semiconductor chips;

a single wiring tape including a wiring layer having a preselected pattern, at least one insulation layer, and at least one adhesive layer, an insulation layer of said at least one insulation layer being disposed between an adhesive layer of said at least one adhesive layer and said wiring layer, an adhesive layer of said at least one adhesive layer occupying an area with boundaries collinear with boundaries of an area occupied by said wiring layer;

outer connecting portions arranged on said wiring tape; and inner connecting portions formed in said wiring tape and connected to electrodes included in each of said at least two semiconductor chips;

two semiconductor chips, which face each other at one surface thereof, are interconnected by said wiring tape; and part of said wiring tape contiguous with part intervening between said two semiconductor chip is bent at edges of said two semiconductor chips and adhered to other surfaces of said two semiconductor chips.

27. A semiconductor module as claimed in claim 28, wherein each two semiconductor devices are electrically connectable via said wiring tape that belongs to a semiconductor device intervening between said two semiconductor devices.

28. A semiconductor module as claimed in claim 26, wherein each two semiconductor chips are electrically connectable via said wiring tape that is adhered to a semiconductor chip intervening between said two semiconductor chips.

29. A semiconductor device comprising:
   at least two semiconductor chips:
   a single wiring tape including a wiring layer a preselected pattern, at least one insulation layer, and at least one adhesive layer, an insulation layer of said at least one insulation layer being disposed between an adhesive layer of said at least one adhesive layer and said wiring layer, an adhesive layer of said at least one adhesive layer occupying an area with boundaries collinear with boundaries of an area occupied by said wiring layer;
   outer connecting portions arranged on said wiring tape; and
   inner connecting portions arranged on said wiring tape and connected to electrodes included in each of said at least two semiconductor chips;
   wherein said at least two semiconductor chips are respectively adhered to opposite surfaces of said wiring tape, and wherein other part of said wiring tape is bent at edges of said semiconductor chips and adhered to other surfaces of said semiconductor chips.

30. A semiconductor device as claimed in claim 29, wherein said outer connecting portions are arranged on, among said at least three surfaces, a pair of surfaces facing each other.

31. A semiconductor device as claimed in claim 29, wherein said outer connecting portions are arranged on, among said at least three surfaces, two pairs of surfaces facing each other.

32. A semiconductor device as claimed in claim 29, wherein said outer connecting portions are arranged on, among said at least three surfaces, three pairs of surfaces facing each other.

33. A semiconductor device as claimed in claim 29, wherein said at least two semiconductor chips comprise two semiconductor chips adhered to each other at rear surfaces thereof.

34. In a semiconductor module comprising a plurality of semiconductor devices, said plurality of semiconductor devices each comprise:
   at least two semiconductor chips;
   a single wiring tape including a wiring layer having a preselected pattern, at least one insulation layer, and at least one adhesive layer, an insulation layer of said at least one insulation layer being disposed between an adhesive layer of said at least one adhesive layer and said wiring layer, an adhesive layer of said at least one adhesive layer occupying an area with boundaries collinear with boundaries of an area occupied by said wiring layer;
   outer connecting portions arranged on said wiring tape; and
   inner connecting portions formed in said wiring tape and connected to electrodes included in each of said at least two semiconductor chips;
   said at least two semiconductor devices are respectively adhered to opposite surfaces of said wiring tape; and
   other part of said wiring tape is bent at edges of said semiconductor chips and adhered to other surfaces of said semiconductor chips.

35. A semiconductor module as claimed in claim 34, wherein each two semiconductor devices are electrically connectable via said wiring tape that belongs to a semiconductor device intervening between said two semiconductor devices.

36. A semiconductor module as claimed in claim 34, wherein each two semiconductor chips are electrically connectable via said wiring tape that is adhered to a semiconductor chip intervening between said two semiconductor chips.

37. In a semiconductor module comprising a plurality of bidimensionally arranged semiconductor devices, said plurality of semiconductor devices each comprise:
   at least two semiconductor chips;
   a single wiring tape including a wiring layer having a preselected pattern, at least one insulation layer, and at least one adhesive layer, an insulation layer of said at least one insulation layer being disposed between an adhesive layer of said at least one adhesive layer and said wiring layer, an adhesive layer of said at least one adhesive layer occupying an area with boundaries collinear with boundaries of an area occupied by said wiring layer;
   outer connecting portions arranged on said wiring tape; and
   inner connecting portions formed in said wiring tape and connected to electrodes included in each of said at least two semiconductor chips;
   said at least two semiconductor devices are respectively adhered to opposite surfaces of said wiring tape; and
   other part of said wiring tape is bent at edges of said semiconductor chips and adhered to other surfaces of said semiconductor chips.

38. A semiconductor module as claimed in claim 37, wherein each two semiconductor devices are electrically connectable via said wiring tape that belongs to a semiconductor device intervening between said two semiconductor devices.

39. A semiconductor module as claimed in claim 37, wherein each two semiconductor chips are electrically connectable via said wiring tape that is adhered to a semiconductor chip intervening between said two semiconductor chips.

40. In a semiconductor module comprising a plurality of tridimensionally arranged semiconductor devices, said plurality of semiconductor devices each comprise:
   at least two semiconductor chips;
   a single wiring tape including a wiring layer having a preselected pattern, at least one insulation layer, and at least one adhesive layer, an insulation layer of said at least one insulation layer being disposed between an adhesive layer of said at least one adhesive layer and said wiring layer, an adhesive layer of said at least one adhesive layer occupying an area with boundaries collinear with boundaries of an area occupied by said wiring layer;
   outer connecting portions arranged on said wiring tape; and
   inner connecting portions formed in said wiring tape and connected to electrodes included in each of said at least two semiconductor chips;
   said at least two semiconductor devices are respectively adhered to opposite surfaces of said wiring tape; and
   other part of said wiring tape is bent at edges of said semiconductor chips and adhered to other surfaces of said semiconductor chips.

41. A semiconductor module as claimed in claim 40, wherein each two semiconductor devices as electrically connectable via said wiring tape that belongs to a semiconductor device intervening between said two semiconductor devices.

42. A semiconductor module as claimed in claim 40, wherein each two semiconductor chips are electrically connectable via said wiring tape that is adhered to a semiconductor chip intervening between said two semiconductor chips.

* * * * *